(12) United States Patent
Noorizadeh et al.

(10) Patent No.: US 12,431,133 B2
(45) Date of Patent: Sep. 30, 2025

(54) SIMULATOR OF PRODUCTION SCENARIOS IN A NON-PRODUCTION DOWNSTREAM ENVIRONMENT

(71) Applicant: Bank of America Corporation, Charlotte, NC (US)

(72) Inventors: Emad Noorizadeh, Plano, TX (US); Donatus Asumu, McKinney, TX (US); Rajan Jhaveri, Plano, TX (US)

(73) Assignee: Bank of America Corporation, Charlotte, NC (US)

( * ) Notice: Subject to any disclaimer, the term of this patent is extended or adjusted under 35 U.S.C. 154(b) by 331 days.

(21) Appl. No.: 18/203,193

(22) Filed: May 30, 2023

(65) Prior Publication Data

US 2024/0404518 A1 Dec. 5, 2024

(51) Int. Cl.
*G10L 15/22* (2006.01)
*G06F 30/27* (2020.01)
*G10L 15/06* (2013.01)
*G10L 15/18* (2013.01)
*G10L 15/183* (2013.01)

(52) U.S. Cl.
CPC .............. *G10L 15/22* (2013.01); *G06F 30/27* (2020.01); *G10L 15/063* (2013.01); *G10L 15/1815* (2013.01); *G10L 15/183* (2013.01); *G10L 2015/0635* (2013.01)

(58) Field of Classification Search
CPC ... G10L 15/22; G10L 15/063; G10L 15/1815; G10L 15/183; G10L 2015/0635; G06F 30/27
See application file for complete search history.

(56) References Cited

U.S. PATENT DOCUMENTS

| | | | |
|---|---|---|---|
| 10,554,817 B1 * | 2/2020 | Sullivan | H04M 7/0036 |
| 11,409,629 B1 * | 8/2022 | Ganti | G06F 21/51 |
| 2017/0270416 A1 * | 9/2017 | Sri | G06Q 10/04 |
| 2021/0174288 A1 * | 6/2021 | Gvildys | G10L 15/26 |
| 2021/0329124 A1 * | 10/2021 | Li | G06Q 10/06398 |
| 2021/0350385 A1 * | 11/2021 | Ellison | G06N 20/00 |
| 2022/0051658 A1 * | 2/2022 | Krishnamoorthy | G06F 18/25 |
| 2022/0129695 A1 * | 4/2022 | Mguni | G06F 18/285 |
| 2022/0394130 A1 * | 12/2022 | Caron | G10L 15/083 |
| 2023/0199116 A1 * | 6/2023 | Koneru | G06F 40/35 |
| | | | 379/88.01 |

(Continued)

*Primary Examiner* — Michael Colucci
(74) *Attorney, Agent, or Firm* — Weiss & Arons LLP

(57) ABSTRACT

A method for simulating a historical call is provided. Methods may receive a communication between a human caller and an interactive voice response system. The communication may have occurred within a production environment. The communication may include utterances communicated by the human caller, responses presented to the human caller by the response system and/or an original outcome of the communication. Methods may receive original components used by the response system to form the responses. The original components may include prediction models and/or parameters. Methods may input the communication and the original components into a simulator. Methods may enable a user to swap out the original components for modified components. Methods may modify the original outcome based on the swap out of the original components for the modified components. Methods may present the modified outcome and the modified components.

20 Claims, 5 Drawing Sheets

(56) References Cited

U.S. PATENT DOCUMENTS

| | | | |
|---|---|---|---|
| 2023/0224408 A1* | 7/2023 | Bohannon | H04L 67/306 379/265.02 |
| 2023/0245651 A1* | 8/2023 | Wang | G06N 5/022 704/275 |
| 2024/0177171 A1* | 5/2024 | Thangappa | G06Q 30/016 |
| 2024/0348663 A1* | 10/2024 | Crabtree | H04L 63/104 |

* cited by examiner

SIMULATOR OF PRODUCTION SCENARIOS IN A NON-PRODUCTION DOWNSTREAM ENVIRONMENT

FIELD OF TECHNOLOGY

Aspects of the disclosure relate to simulators.

BACKGROUND OF THE DISCLOSURE

Communications between interactive voice and text response systems and humans may resolve positively or negatively for the humans. Many times, entities that utilize such systems intend that the outcome of the communications resolve positively for the humans. Positive communication resolutions may encourage humans to employ the interactive voice and text response system at another time.

Furthermore, entities may intend that the outcome of the communications not resolve negatively for the humans. Entities may specifically intend that the outcome of the communications not include negative sentiment because entities may intend that callers, which may be entity customers, should not associate negative sentiment with entity communications.

Because it is important to ascertain quality control of the communications that occur within an interactive voice and text response system, it may be desirable to utilize a simulator. It would be further desirable for the simulator to simulate a call in an environment downstream of a production environment. It would be yet further desirable for the simulator to select communications that are associated with a sentiment level that is less than predetermined positively level. It would be yet further desirable to enable a user operating the simulator to swap out various components of the interactive voice response system in order to raise the predetermined positively level of the communication outcome. It would be yet further desirable for the simulator to tune the interactive response system, based on information obtained from the swap out of the various components, to more effectively respond to future calls.

SUMMARY OF THE DISCLOSURE

Apparatus, systems and methods for communication simulation are provided. The simulation system may include an interactive voice response system. An interactive voice response system may be a computing system that communicates with a human. The computing system may utilize artificial intelligence, machine learning and/or any other suitable algorithms to understand, and respond to, requests communicated by a user.

The interactive voice response system may operate on a hardware processor and a hardware memory. The interactive voice response system may be operable to receive and respond to a plurality of communications transmitted by human callers.

The system may include a recorder. The recorder may also operate on the hardware processor and the hardware memory. The recorder may record each communication included in the plurality of communications. The recorder may be an automatic speech recognition ("ASR") system. The automatic speech recognition system may transcribe communications. As such, the ASR may also be referred to as a voice to text system.

The system may include a selector. The selector may also operate on the hardware processor and the hardware memory. The selector may select one or more communications from the plurality of recorded communications. The selected one or more communications may be communications in which an original outcome of the communications includes negative sentiment expressed by a human caller.

At times, the selected one or more communications may be communications in which the original outcome of the communications includes positive sentiment expressed by the human caller. The selected one or more communications may be selected based on any suitable set of criteria.

In some embodiments, the selector may utilize machine learning, artificial intelligence and/or one or more supervised and/or unsupervised algorithms to identify the communications in which the human caller expressed negative sentiment in the outcome of the communication.

In certain embodiments, the selector may interact with a user and receive user input to identify a communication in which the human caller expressed negative sentiment. It should be noted that, at times, within an entity, communications may be labeled with session identifiers. As such, if a human caller communicates, at a later point, negative sentiment associated with a historical communication, a user may be able to retrieve the historical communication based on the session identifier and/or any other suitable information. The other suitable information may include an identifier associated with the human caller, such as a name or telephone number, a date time stamp and/or any other suitable information. Once the historical communication is identified, a user may instruct the selector to select the identified historical communication for simulation.

The system may include a simulator. The simulator may operate on the hardware processor and the hardware memory. The simulator may simulate each of the one or more communications. The simulator may enable a user to swap out one or more original parameters and/or one or more original prediction models for one or more modified parameters and/or one or more modified prediction models. The parameters and/or prediction models may be used by the interactive voice response system to respond to each of the one or more communications.

Based on the swap out of the one or more original parameters and/or one or more original prediction models, the simulator may modify the original outcome of the communication. The modified outcome of the communication may be displayed to the user and/or made available for viewing by the user.

The parameters may include a voice tone used by the interactive voice response system, a voice speed used by the interactive voice response system, an inter-conversational gap used by the interactive voice response system (how much time lapses between the human caller completing an utterance and the system responding), a vocabulary level used by the interactive voice response system, a number of response attempts made by the interactive voice response system prior to forwarding the communication to a human agent and any other suitable parameters.

The prediction models may include a classical prediction model, a contextual prediction model and any other suitable prediction models. A classical prediction model may consider only a most recent utterance included in a communication to produce a response to a most recent utterance within the conversation. A contextual prediction model may consider all utterances included in a communication to produce a response to a most recent utterance within a communication. It should be noted that classical prediction models may provide quicker results and use less computing resources. Contextual prediction models may provide responses with greater accuracy because it views the conversation as a whole. However, contextual prediction models may consume greater amounts of resources and may not always provide correct, pointed responses that human callers are requesting. Therefore, at times classical prediction models may be used, other times, contextual prediction models may be used.

At times, the prediction model and/or the parameters may be hardcoded into the interactive voice response system. However, at other times, a machine learning model may operate together with the interactive voice response system to select a relevant prediction model and/or relevant parameters for each communication.

The simulator may assign an original sentiment level to the original outcome of the one or more communications. The simulator may assign a modified sentiment level to the modified outcome of the one or more communications. The simulator may identify that the modified sentiment level is more positive than the original sentiment level.

A machine learning model, operating an the interactive voice response system, may replace the one or more original parameters and/or one or more original prediction models for the one or more modified parameters and/or the one or more modified prediction models.

BRIEF DESCRIPTION OF THE DRAWINGS

The objects and advantages of the invention will be apparent upon consideration of the following detailed description, taken in conjunction with the accompanying drawings, in which like reference characters refer to like parts throughout, and in which.

DETAILED DESCRIPTION OF THE DISCLOSURE

Figure 1A:
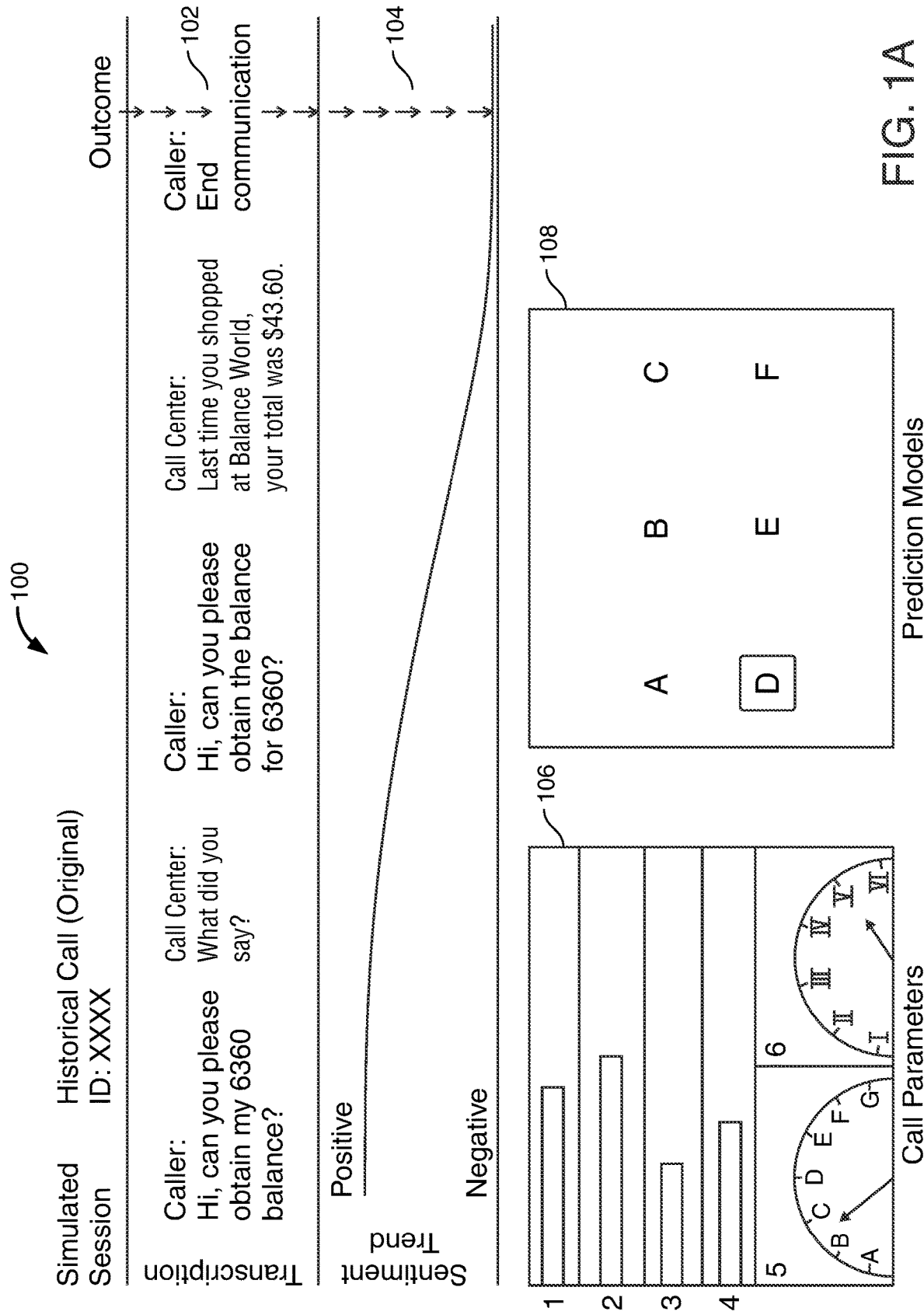
FIGS. 1A and 1B show illustrative diagrams in accordance with principles of the disclosure.

Apparatus and methods for updating machine learning models based on sentiment of outcomes of communications within an interactive voice response system. Methods may be executed by an interactive voice response system, a chatbot and/or any other suitable computing system.

Methods may include receiving a plurality of communications transmitted by human callers. Methods may include responding to the plurality of communications. The responses may be based on machine learning, artificial intelligence, supervised and/or unsupervised algorithms and/or any other suitable response generator.

Methods may include recording the plurality of communications. The recording may be executed by a voice to text transformation unit. The voice to text transformation unit may transcribe a voice call to text. The transcription may occur in real-time as the communication is occurring.

Methods may include selecting a subset of the plurality of communications from the plurality of recorded communications. A selector unit may execute the selecting. The subset of the plurality of communications may include communications that included an original outcome that includes negative sentiment expressed by human callers.

Methods may include simulating each communication included in the subset of the plurality of communications. A simulator unit may execute the simulating.

Methods may include enabling a user to swap out one or more original parameters and/or one or more original prediction models for one or modified parameters and/or one or more modified prediction models. The simulator unit may enable the simulating. The prediction models and/or parameters may be used by the interactive voice response system to form response to communications included in the subset of the plurality of communications.

Methods may include modifying the original outcome of the communications included in the subset of the plurality of communications. The simulator unit may enable the modifying. The modifying may be based on the swap out of the one or more original parameters and/or one or more original prediction models.

Methods may include displaying the modified outcome of communications included in the subset of the plurality of communications.

Methods may include assigning an original sentiment level to each original outcome of each communication included in the subset of the plurality of communications. Methods may include assigning a modified sentiment level to each modified outcome of each communication included in the subset of the plurality of communications.

Methods may include identified that the modified sentiment level for each modified outcome of each communication included in the subset of the plurality of communications is more positive than the original sentiment level.

Methods may include replacing the one or more original parameters with the one or more modified parameters and/or one or more modified prediction models. The one or more original prediction models and/or the one or more modified prediction models may include a contextual prediction model and/or a classical prediction model.

Apparatus and methods described herein are illustrative. Apparatus and methods in accordance with this disclosure will now be described in connection with the figures, which form a part hereof. The figures show illustrative features of apparatus and method steps in accordance with the principles of this disclosure. It is to be understood that other embodiments may be utilized and that structural, functional and procedural modifications may be made without departing from the scope and spirit of the present disclosure.

The steps of methods may be performed in an order other than the order shown or described herein. Embodiments may omit steps shown or described in connection with illustrative methods. Embodiments may include steps that are neither shown nor described in connection with illustrative methods.

Illustrative method steps may be combined. For example, an illustrative method may include steps shown in connection with another illustrative method.

Apparatus may omit features shown or described in connection with illustrative apparatus. Embodiments may include features that are neither shown nor described in connection with the illustrative apparatus. Features of illustrative apparatus may be combined. For example, an illustrative embodiment may include features shown in connection with another illustrative embodiment.

FIG. 1A shows an illustrative diagram. The illustrative diagram shows dashboard 100. Dashboard 100 shows a simulated historical call. It should be noted that the simulated historical call shown on dashboard 100 may display the call as it took place and may not include modifications.

A transcription of the call may be shown at 102. The transcription of the call may include utterances made by the caller and responses made by the call center.

A sentiment trend of the call may be shown at 104. The sentiment trend may shift from positive sentiment to negative sentiment. The outcome of the communication may include a communication end or stop by the caller. The sentiment of the communication may be substantially completely negative at the close of the communication.

Call parameters may be shown at 106. A model at the call center may operate with a plurality of parameters. Each of the parameters may be set to a value. The values may be known as parameter values.

Prediction models may be shown at 108. A model at the call center may operate with one or more prediction models. The selected prediction model may be D, as shown selected at 108.

Figure 1B:
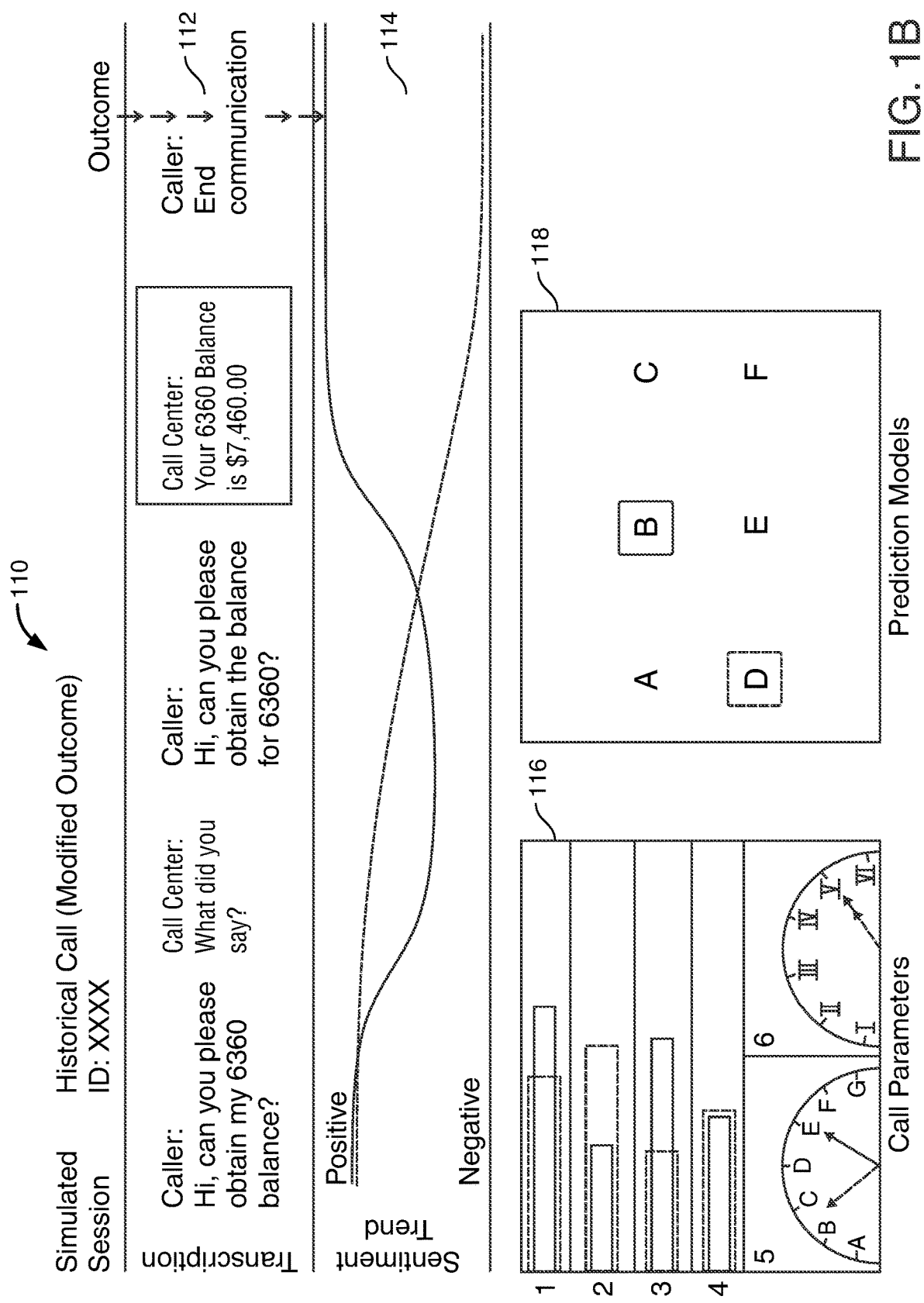

FIG. 1B shows an illustrative diagram. The illustrative diagram shows dashboard 110. Dashboard 110 shows a simulated historical call. It should be noted that the simulated historical call shown on dashboard 110 may display the call as it took place and may include modifications made to the call.

Call parameters may be shown at 116. A model at the call center may operate with a plurality of parameters. Each of the parameters may be set to a value. The values may be known as parameter values. The call parameters may be modified. The modified parameters may be shown at 116.

Prediction models may be shown at 118. A model at the call center may operate with one or more prediction models. The previously selected prediction model may be D, as shown previously selected at 118. The prediction models may be modified. The modified prediction model that is selected may be B, as shown selected 118.

A transcription of the call may be shown at 112. The transcription of the call may include utterances made by the caller and responses made by the call center. The transcription of the call may be modified based on the parameters modified at 116 and 118.

A sentiment trend of the call may be shown at 114. The previous sentiment trend may shift from positive sentiment to negative sentiment. The previous outcome of the communication may include a communication end or stop by the caller. The previous sentiment of the communication may be substantially completely negative at the close of the communication. The modified sentiment trend may shift from positive sentiment to neutral sentiment to positive sentiment. The modified outcome of the communication may include a communication end or stop by the caller. The modified sentiment of the communication may be substantially completely positive at the close of the communication. As such, a model operating the response system may implement modifications based on the modifications to the call parameters and prediction models that generated a more positive outcome to the communication.

Figure 2:
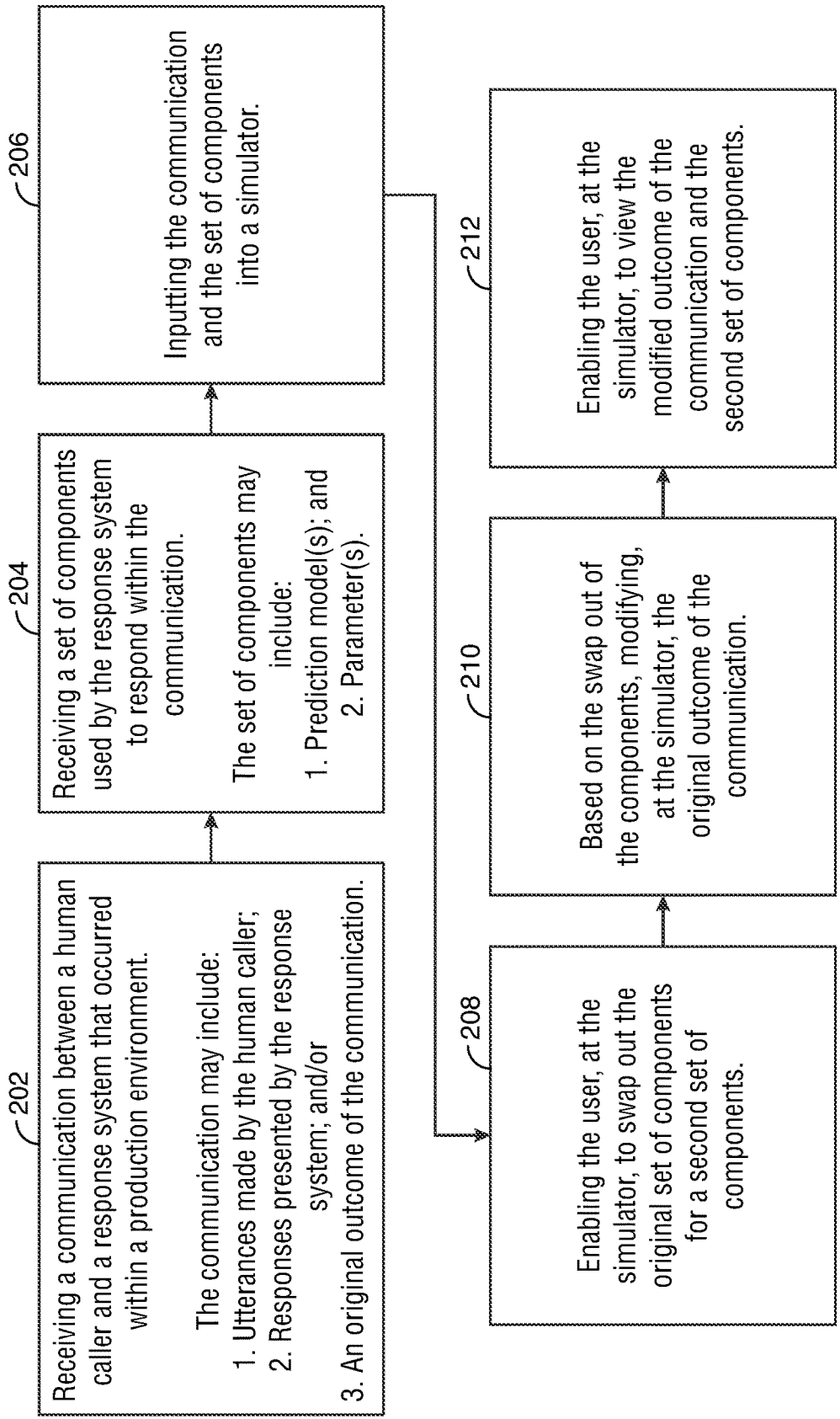
FIG. 2 shows an illustrative flow chart in accordance with principles of the disclosure.

FIG. 2 shows an illustrative flow chart. The illustrative flow chart shows a call simulation method.

At step 202, the method may include receiving a communication between a human caller and a response system. The communication may have occurred within a production environment. The communication may include utterances made by the human caller, responses presented by the response system and/or an original outcome of the communication.

At step 204, the method may include receiving a set of components used by the response system to respond within the communication. The set of components may include one or more prediction models and one or more parameters.

At step 206, the method may include inputting the communication and the set of components into a simulator. At step 208, the method may include enabling a user, a the simulator, to swap out the original set of components for a second set of components.

At step 210, the method may include based on the swap out of the components, modifying, at the simulator, the original outcome of the communication. At step 212, the method may include enabling the user, at the simulator to view the modified outcome of the communication and the second set of components.

Figure 3:
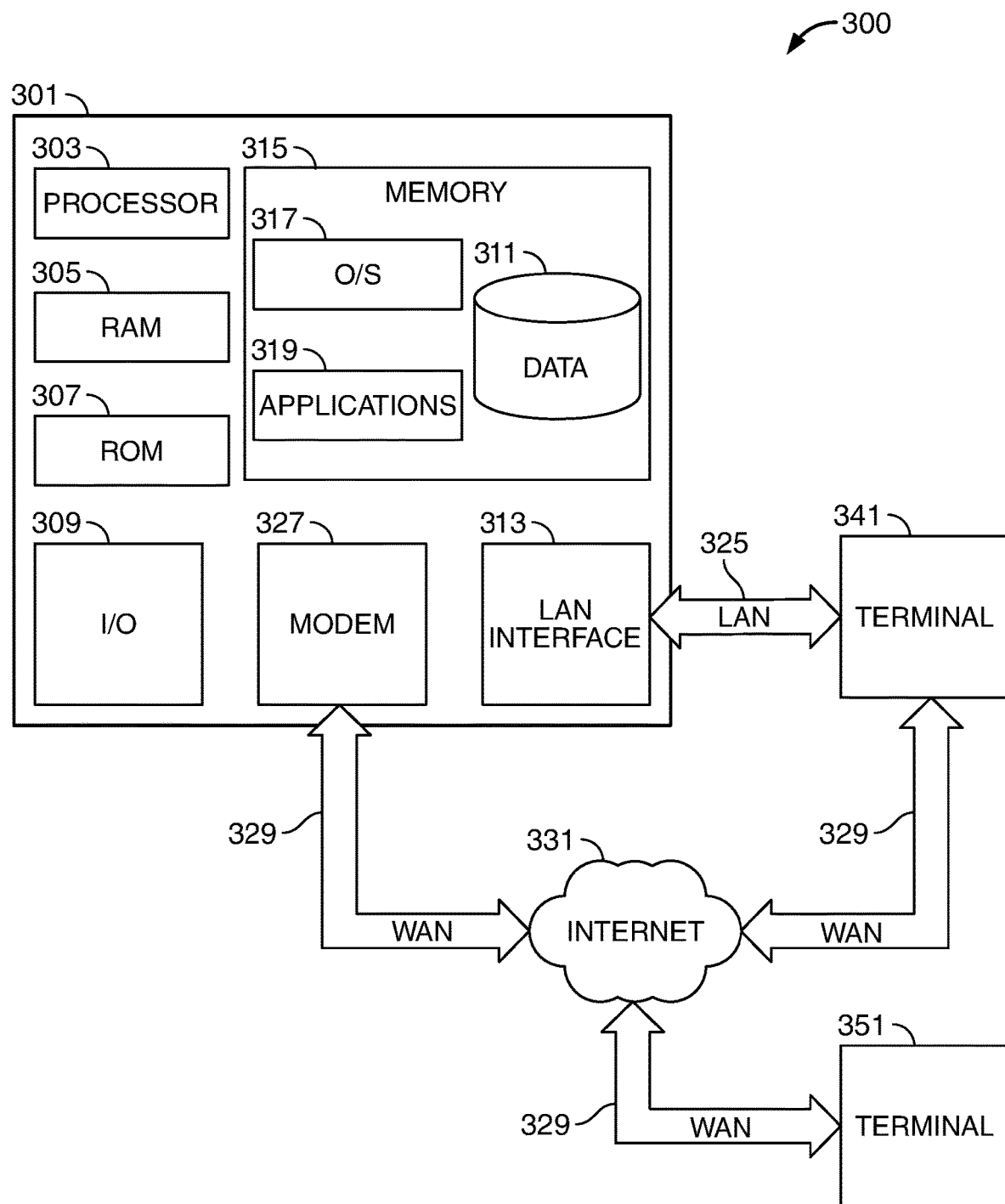
FIG. 3 shows another illustrative diagram in accordance with principles of the disclosure.

FIG. 3 shows an illustrative block diagram of system 300 that includes computer 301. Computer 301 may alternatively be referred to herein as a "server" or a "computing device." Computer 301 may be a workstation, desktop, laptop, tablet, smart phone, or any other suitable computing device. Elements of system 300, including computer 301, may be used to implement various aspects of the systems and methods disclosed herein.

Computer 301 may have a processor 303 for controlling the operation of the device and its associated components, and may include RAM 305, ROM 307, input/output module 309, and a memory 315. The processor 303 may also execute all software running on the computer—e.g., the operating system and/or voice recognition software. Other components commonly used for computers, such as EEPROM or Flash memory or any other suitable components, may also be part of the computer 301.

The memory 315 may comprise any suitable permanent storage technology—e.g., a hard drive. The memory 315 may store software including the operating system 317 and application(s) 319 along with any data 311 needed for the operation of the system 300. Memory 315 may also store videos, text, and/or audio assistance files. The videos, text, and/or audio assistance files may also be stored in cache memory, or any other suitable memory. Alternatively, some or all of computer executable instructions (alternatively referred to as "code") may be embodied in hardware or firmware (not shown). The computer 301 may execute the instructions embodied by the software to perform various functions.

Input/output ("I/O") module may include connectivity to a microphone, keyboard, touch screen, mouse, and/or stylus through which a user of computer 301 may provide input. The input may include input relating to cursor movement. The input may relate to transaction pattern tracking and prediction. The input/output module may also include one or more speakers for providing audio output and a video display device for providing textual, audio, audiovisual, and/or graphical output. The input and output may be related to computer application functionality. The input and output may be related to transaction pattern tracking and prediction.

System 300 may be connected to other systems via a local area network (LAN) interface 313.

System 300 may operate in a networked environment supporting connections to one or more remote computers, such as terminals 341 and 351. Terminals 341 and 351 may be personal computers or servers that include many or all of the elements described above relative to system 300. The network connections depicted in FIG. 3 include a local area network (LAN) 325 and a wide area network (WAN) 329, but may also include other networks. When used in a LAN networking environment, computer 301 is connected to LAN 325 through a LAN interface or adapter 313. When used in a WAN networking environment, computer 301 may include a modem 327 or other means for establishing communications over WAN 329, such as Internet 331.

It will be appreciated that the network connections shown are illustrative and other means of establishing a communications link between computers may be used. The existence of various well-known protocols such as TCP/IP, Ethernet, FTP, HTTP and the like is presumed, and the system can be operated in a client-server configuration to permit a user to retrieve web pages from a web-based server. The web-based server may transmit data to any other suitable computer system. The web-based server may also send computer-readable instructions, together with the data, to any suitable computer system. The computer-readable instructions may be to store the data in cache memory, the hard drive, secondary memory, or any other suitable memory.

Additionally, application program(s) 319, which may be used by computer 301, may include computer executable instructions for invoking user functionality related to communication, such as e-mail, Short Message Service (SMS), and voice input and speech recognition applications. Application program(s) 319 (which may be alternatively referred to herein as "plugins," "applications," or "apps") may include computer executable instructions for invoking user functionality related to performing various tasks. The various tasks may be related to transaction pattern tracking and prediction.

Computer 301 and/or terminals 341 and 351 may also be devices including various other components, such as a battery, speaker, and/or antennas (not shown).

Terminal 351 and/or terminal 341 may be portable devices such as a laptop, cell phone, Blackberry TM, tablet, smartphone, or any other suitable device for receiving, storing, transmitting and/or displaying relevant information. Terminals 351 and/or terminal 341 may be other devices. These devices may be identical to system 300 or different. The differences may be related to hardware components and/or software components.

Any information described above in connection with database 311, and any other suitable information, may be stored in memory 315. One or more of applications 319 may include one or more algorithms that may be used to implement features of the disclosure, and/or any other suitable tasks.

The invention may be operational with numerous other general purpose or special purpose computing system environments or configurations. Examples of well-known computing systems, environments, and/or configurations that may be suitable for use with the invention include, but are not limited to, personal computers, server computers, hand-held or laptop devices, tablets, mobile phones, smart phones and/or other personal digital assistants ("PDAs"), multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer. Generally, program modules include routines, programs, objects, components, data structures, etc., that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

Figure 4:
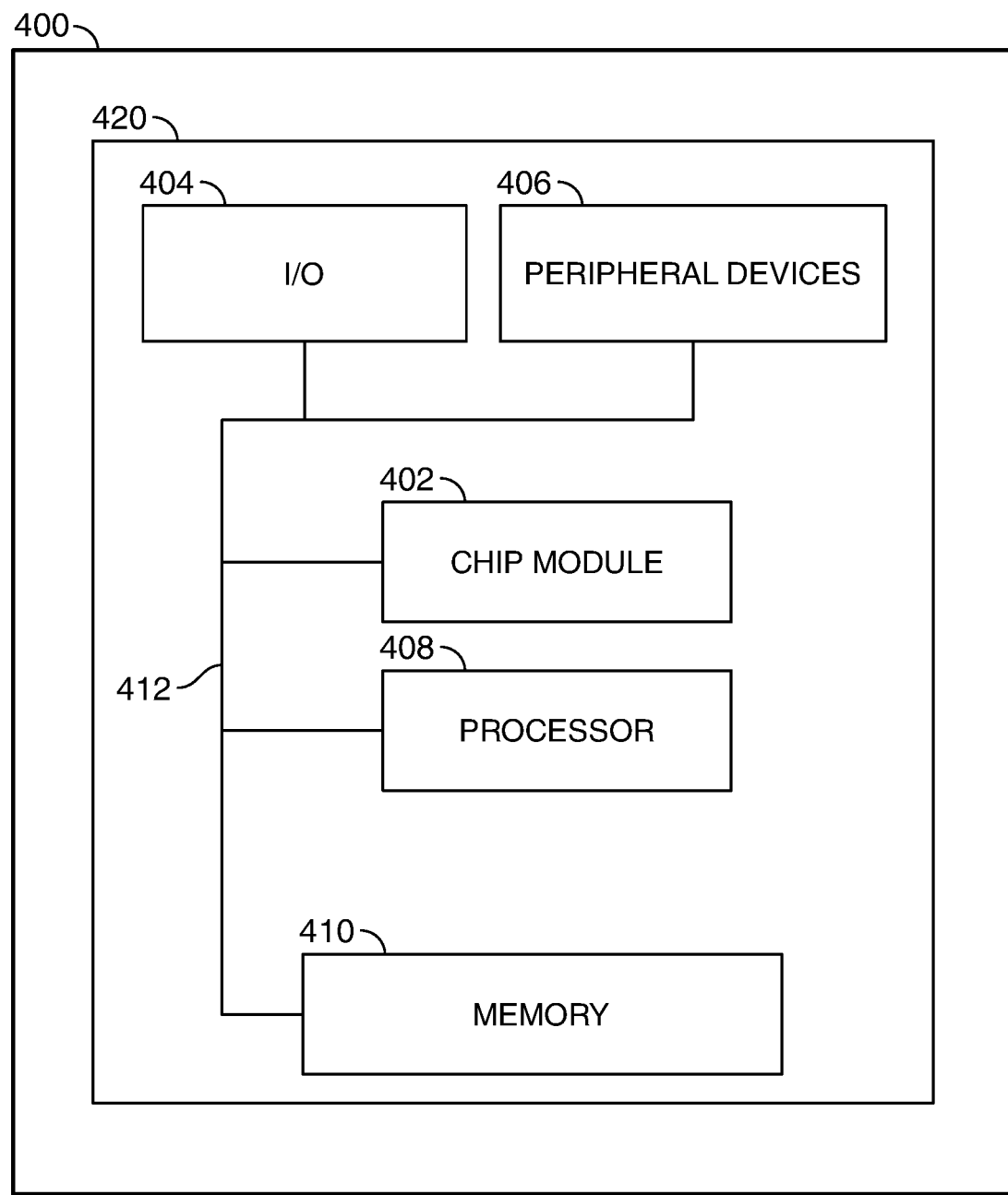
FIG. 4 shows yet another illustrative diagram in accordance with principles of the disclosure.

FIG. 4 shows illustrative apparatus 400 that may be configured in accordance with the principles of the disclosure. Apparatus 400 may be a computing machine. Apparatus 400 may include one or more features of the apparatus shown in FIG. 3. Apparatus 400 may include chip module 402, which may include one or more integrated circuits, and which may include logic configured to perform any other suitable logical operations.

Apparatus 400 may include one or more of the following components: I/O circuitry 404, which may include a transmitter device and a receiver device and may interface with fiber optic cable, coaxial cable, telephone lines, wireless devices, PHY layer hardware, a keypad/display control device or any other suitable media or devices; peripheral devices 406, which may include counter timers, real-time timers, power-on reset generators or any other suitable peripheral devices; logical processing device 408, which may compute data structural information and structural parameters of the data; and machine-readable memory 410.

Machine-readable memory 410 may be configured to store in machine-readable data structures: machine executable instructions (which may be alternatively referred to herein as "computer instructions" or "computer code"), applications, signals, and/or any other suitable information or data structures.

Components 402, 404, 406, 408 and 410 may be coupled together by a system bus or other interconnections 412 and may be present on one or more circuit boards such as 420. In some embodiments, the components may be integrated into a single chip. The chip may be silicon-based.

Thus, systems and methods for a simulator of production scenarios in a non-production downstream environment are provided. Persons skilled in the art will appreciate that the present invention can be practiced by other than the described embodiments, which are presented for purposes of illustration rather than of limitation. The present invention is limited only by the claims that follow.

What is claimed is:

1. A method for simulating a historical call, the method comprising:
   receiving a communication between a human caller and an interactive voice response system, the communication that occurred within a production environment, the communication comprising:
   one or more utterances communicated by the human caller;
   one or more responses presented to the human caller by the interactive voice response system; and
   an original outcome of the communication;
   receiving a set of components used by the interactive voice response system to form the one or more responses, the set of components comprising:
   one or more prediction models; and
   one or more parameters;
   inputting the communication and the set of components into a hardware-processor-based simulator program component;
   enabling a user, at the hardware-processor-based simulator program component, to swap out one or more components included in the set of components for a second one or more components;

based on the swap out of the one or more components, modifying, at the hardware-processor-based simulator program component, the original outcome of the communication; and enabling the user, at the hardware-processor-based simulator program component, to view the modified outcome of the communication and the second one or more components.

2. The method of claim 1 further comprising, based on modifying the outcome of the communication following the swap out of the one or more components for the second one or more components, identifying that the modified outcome of the communication is more positive, on a predetermined positive sentiment scale, than the original outcome of the communication.

3. The method of claim 2 further comprising replacing, at a machine learning model operating at the interactive voice response system, the one or more components with the second one or more components to tune the machine learning model.

4. The method of claim 1 wherein the one or more parameters comprise one or more prediction models.

5. The method of claim 4 wherein the one or more prediction models comprises a contextual prediction model and/or a classical prediction model.

6. The method of claim 5 wherein:
the contextual prediction model considers all utterances included in the communication to produce a response to a most recent utterance; and
the classical prediction model considers a most recent utterance in the communication to produce a response to a most recent utterance.

7. The method of claim 1 wherein the communication comprises one or more complaints in which the human caller indicated negative sentiment.

8. The method of claim 7 wherein the original outcome includes the human caller indicating negative sentiment and the modified outcome includes the human caller indicating neutral and/or positive sentiment.

9. A voice call simulation system, the system comprising:
an interactive voice response system, operating on a hardware processor and a hardware memory, operable to receive and respond to a plurality of communications transmitted by human callers;
a recorder, operating on the hardware processor and the hardware memory, operable to record each communication included in the plurality of communications;
a selector, operating on the hardware processor and the hardware memory, operable to select, from the plurality of recorded communications, one or more communications in which an original outcome of the one or more communications includes negative sentiment expressed by a human caller;
a hardware-processor-based simulator program component, operating on the hardware processor and the hardware memory, operable to:
simulate each of the one or more communications;
enable a user to swap out one or more original parameters and/or one or more original prediction models for one or more modified parameters and/or one or more modified prediction models used by the interactive voice response system to respond to each of the one or more communications;
based on the swap out of the one or more original parameters and/or one or more original prediction models, modify the original outcome of the one or more communications; and
enable the user to view the modified outcome of the one or more communications.

10. The system of claim 9 wherein the system further comprises:
the simulator is further operable to:
assign an original sentiment level to the original outcome of the one or more communications;
assign a modified sentiment level to the modified outcome of the one or more communications; and
identify that the modified sentiment level is more positive than the original sentiment level;
a machine learning model, operating at the interactive voice response system, operable to:
replace the one or more original parameters and/or one or more original prediction models for the one or more modified parameters and/or one or more modified prediction models.

11. The system of claim 9 wherein the one or more original prediction models comprises a contextual prediction model and/or a classical prediction model.

12. The system of claim 11 wherein:
the contextual prediction model considers all utterances included in each communication to produce a response to a most recent utterance within each communication; and
the classical prediction model considers all utterances included in each communication to produce a response to a most recent utterance within each communication.

13. The system of claim 10 wherein the one or more modified prediction models comprises a contextual prediction model and/or a classical prediction model.

14. The system of claim 13 wherein:
the contextual prediction model considers all utterances included in each communication to produce a response to a most recent utterance within each communication; and
the classical prediction model considers all utterances included in each communication to produce a response to a most recent utterance within each communication.

15. A method for updating machine learning models based on sentiment of outcomes of communications within an interactive voice response system, the method comprising:
receiving, at an interactive voice response system, a plurality of communications transmitted by human callers;
responding, at the interactive voice response system, to the plurality of communications;
recording, at a hardware-processor-based voice to text transformation unit program component, the plurality of communications;
selecting, at a hardware-processor-based selector unit program component, a subset of the plurality of communications from the plurality of recorded communications, the subset of the plurality of communications comprising communications including an original outcome that includes negative sentiment expressed by human callers;
simulating, at a hardware-processor-based simulator unit program component, each communication included in the subset of the plurality of communications;
enabling, at the at a hardware-processor-based simulator unit program component, a user to swap out one or more original parameters and/or one or more original prediction models for one or more modified parameters and/or one or more modified prediction models used by the interactive voice response system to form responses to communications included in the subset of the plurality of communications;

modifying, at the at a hardware-processor-based simulator unit program component, based on the swap out of the one or more original parameters and/or one or more original prediction models, the original outcome of communications included in the subset of the plurality of communications; and displaying, at the at a hardware-processor-based simulator unit program component, the modified outcome of communications included in the subset of the plurality of communications.

16. The method of claim 15 further comprising:

assigning an original sentiment level to each original outcome of each communication included in the subset of the plurality of communications;

assigning a modified sentiment level to each modified outcome of each communication included in the subset of the plurality of communications;

identifying that the modified sentiment level for each modified outcome of each communication included in the subset of the plurality of communications is more positive than the original sentiment level;

replacing, at a machine learning model operating at the interactive voice response system, the one or more original parameters with the one or more modified parameters and/or one or more modified prediction models.

17. The method of claim 15 wherein the one or more original prediction models comprises a contextual prediction model and/or a classical prediction model.

18. The method of claim 17 wherein:

the contextual prediction model considers all utterances included in each communication to produce a response to a most recent utterance within each communication; and the classical prediction model considers all utterances included in each communication to produce a response to a most recent utterance within each communication.

19. The method of claim 15 wherein the one or more modified prediction models comprises a contextual prediction model and/or a classical prediction model.

20. The method of claim 19 wherein:

the contextual prediction model considers all utterances included in each communication to produce a response to a most recent utterance within each communication; and the classical prediction model considers all utterances included in each communication to produce a response to a most recent utterance within each communication.

* * * * *